US012749663B2

(12) United States Patent
Kim et al.

(10) Patent No.: US 12,749,663 B2
(45) Date of Patent: Sep. 29, 2026

(54) SUBSTRATE PROCESSING MODULE AND LASER BEAM PROVIDING METHOD

(71) Applicant: SEMES CO., LTD., Cheonan-si (KR)

(72) Inventors: Kwang Ryul Kim, Suwon-si (KR); Yunsang Kim, Seongnam-si (KR)

(73) Assignee: SEMES CO., LTD., Cheonan-si (KR)

(*) Notice: Subject to any disclaimer, the term of this patent is extended or adjusted under 35 U.S.C. 154(b) by 617 days.

(21) Appl. No.: 18/213,863

(22) Filed: Jun. 25, 2023

(65) Prior Publication Data

US 2024/0006167 A1 Jan. 4, 2024

(30) Foreign Application Priority Data

Jun. 30, 2022 (KR) ........................ 10-2022-0080848

(51) Int. Cl.
*H01J 37/32* (2006.01)
*C23C 16/455* (2006.01)
(Continued)

(52) U.S. Cl.
CPC .. *H01J 37/32724* (2013.01); *C23C 16/45544* (2013.01); *C23C 16/483* (2013.01); *H01J 37/22* (2013.01); *H10P 72/0436* (2026.01)

(58) Field of Classification Search
CPC .. H01J 37/32724; H01J 37/22; H01J 37/3244; H01J 37/32431; H01J 2237/332; H01J 2237/334; H01J 37/32119; C23C 16/45544; C23C 16/483; C23C 16/45536; C23C 16/46; C23C 16/54; C23C 16/45551; C23C 16/545; C23C 16/4412;
(Continued)

(56) References Cited

U.S. PATENT DOCUMENTS 5,156,461 A * 10/1992 Moslehi ................ G01J 5/0868 374/161
5,255,286 A * 10/1993 Moslehi ................ G01J 5/0802 374/161
(Continued)

FOREIGN PATENT DOCUMENTS

JP H05291107 A * 11/1993 ........... H01L 21/027
JP 2000-223425 8/2000
(Continued)

OTHER PUBLICATIONS

Office Action from the Korean Intellectual Property Office dated Apr. 12, 2024.

*Primary Examiner* — Rudy Zervigon

(57) ABSTRACT

Provided is a substrate processing module including a plurality of substrate processing apparatuses each including a process chamber having a processing space therein, a support unit for supporting a substrate in the processing space, a gas supply unit for supplying a process gas into the processing space, a plasma source for forming plasma from the process gas supplied into the processing space, and a laser unit for heating the substrate by irradiating a laser beam onto the substrate, wherein the substrate processing module further includes a laser beam generator for generating a laser beam, and a laser beam distribution unit for receiving the laser beam from the laser beam generator and distributing the laser beam to the laser units of the plurality of substrate processing apparatuses at time intervals.

17 Claims, 11 Drawing Sheets

(51) Int. Cl.
*C23C 16/48* (2006.01)
*H01J 37/22* (2006.01)
*H10P 72/00* (2026.01)

(58) Field of Classification Search
CPC ............... C23C 14/568; C23C 16/4401; H10P 72/0436; H10P 14/20; H10P 50/242; H10P 72/0421; H10P 72/0468; B23K 26/0643; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
USPC ........................ 118/719; 156/345.31, 345.32
See application file for complete search history.

(56) References Cited

U.S. PATENT DOCUMENTS

| | | | | |
|---|---|---|---|---|
| 5,317,656 | A * | 5/1994 | Moslehi | G01J 5/0821 385/115 |
| 5,508,934 | A * | 4/1996 | Moslehi | G01J 5/0003 700/121 |
| 2013/0243971 | A1* | 9/2013 | Thompson | C23C 16/45548 118/723 R |
| 2022/0084847 | A1* | 3/2022 | Lee | F27D 5/0037 |

FOREIGN PATENT DOCUMENTS

| | | | | |
|---|---|---|---|---|
| JP | 2003068703 | A * | 3/2003 | H01L 21/3063 |
| KR | 100514392 | B1 * | 9/2005 | H10P 34/42 |
| KR | 10-2018-0104914 | | 9/2018 | |
| KR | 10-2019-0047450 | | 5/2019 | |
| KR | 10-2022-0035734 | | 3/2022 | |

* cited by examiner

SUBSTRATE PROCESSING MODULE AND LASER BEAM PROVIDING METHOD

CROSS-REFERENCE TO RELATED PATENT APPLICATION

This application claims the benefit of Korean Patent Application No. 10-2022-0080848, filed on Jun. 30, 2022, in the Korean Intellectual Property Office, the disclosure of which is incorporated herein in its entirety by reference.

BACKGROUND OF THE INVENTION

1. Field of the Invention

The present invention relates to a semiconductor apparatus and, more particularly, to a substrate processing module and laser beam providing method used for plasma etching.

2. Description of the Related Art

Plasma refers to an ionized state of a gas composed of ions, electrons, radicals, or the like and may be formed by a very high temperature, a strong electric field, or a high radio-frequency (RF) electromagnetic field. Plasma applicable to plasma processing apparatuses includes capacitively coupled plasma, inductively coupled plasma (ICP), microwave plasma, etc.

For example, in a semiconductor process, plasma may be used for etching. The etching process may be performed by forming plasma on a substrate and accelerating ions in the plasma toward the substrate to remove a thin film on the substrate.

In a plasma processing apparatus for performing thermal atomic layer etching (ALE), a reactive gas supplied into a process chamber forms plasma by obtaining energy required for ionization from an induced electric field. The surface of a substrate is heated to react with the reactive gas. The heated surface of the substrate is reduced in bonding energy with a reactive material and in this state, when a physical impact is applied to the surface of the substrate with the plasma ions, an atomic layer on the surface of the substrate is removed. The above-described thermal ALE process may reduce a process time and minimize damage to the substrate. However, because a laser device for generating a laser beam having a power of several to several tens of kW is very high-priced, a method capable of using the laser device as efficiently as possible is required.

SUMMARY OF THE INVENTION

The present invention provides a substrate processing module and laser beam providing method capable of efficiently using a laser device to heat substrates in a procedure of heating the substrates by using laser beams.

The present invention also provides a substrate processing module and laser beam providing method capable of providing laser beams to a plurality of substrate processing apparatuses by using one or a small number of laser devices.

However, the scope of the present invention is not limited thereto.

According to an aspect of the present invention, there is provided a substrate processing module including a plurality of substrate processing apparatuses each including a process chamber having a processing space therein, a support unit for supporting a substrate in the processing space, a gas supply unit for supplying a process gas into the processing space, a plasma source for forming plasma from the process gas supplied into the processing space, and a laser unit for heating the substrate by irradiating a laser beam onto the substrate, wherein the substrate processing module further includes a laser beam generator for generating a laser beam, and a laser beam distribution unit for receiving the laser beam from the laser beam generator and distributing the laser beam to the laser units of the plurality of substrate processing apparatuses at time intervals.

The laser beam distribution unit may distribute the laser beam to the laser units of at least two substrate processing apparatuses among the plurality of substrate processing apparatuses at time intervals.

The substrate processing module may include a plurality of laser beam distribution units, and each laser beam distribution unit may distribute the laser beam to the laser units of at least two substrate processing apparatuses among the plurality of substrate processing apparatuses at time intervals.

The substrate processing module may include a plurality of laser beam generators, and each laser beam distribution unit may distribute the laser beam to the laser units of the same number or a different number of at least two substrate processing apparatuses at time intervals.

The laser beam distribution unit may be included in the laser beam generator.

The laser beam may be a pulsed laser beam.

A time taken for the laser beam distribution unit to distribute the laser beam to the laser units each of the plurality of substrate processing apparatuses may be 1 nanosecond (ns) to 100 milliseconds (ms).

At least one electrode of the plasma source may be a transparent electrode, and the laser beam may pass through the transparent electrode and be irradiated onto the substrate.

The substrate processing apparatuses may be used for a thermal atomic layer etching (ALE) or atomic layer deposition (ALD) process.

One cycle of the thermal ALE or ALD process may be 5 seconds (s) to 60 s, and the laser beam distribution unit may distribute the laser beam to the laser units of the substrate processing apparatuses within the one cycle.

A start timing of the one cycle may be shifted for the substrate processing apparatuses.

A time of the one cycle may be longer than a product of a time taken to distribute the laser beam to one substrate processing apparatus and the number of substrate processing apparatuses.

The laser beam distribution unit may include a module housing, and a distribution member disposed inside the module housing to distribute an incident laser beam to a first path or a second path.

The distribution member may be provided as a mirror that totally reflects the incident laser beam to the first or second path.

The laser beam distribution unit may include a plurality of distribution members, and the incident laser beam may be distributed to paths at least one more than the number of distribution members.

The substrate processing module may include a plurality of laser beam generators, laser beams generated by the laser beam generators may be irradiated onto one substrate processing apparatus, and a first pulsed laser beam generated by a first laser beam generator and a first pulsed laser beam generated by a second laser beam generator may be irradiated in such a manner that a first pulse region of the first pulsed laser beam generated by a second laser beam generator is positioned between first and second pulse regions of the first pulsed laser beam generated by a first laser beam generator.

According to another aspect of the present invention, there is provided a method of providing a laser beam to a plurality of substrate processing apparatuses used for a thermal atomic layer etching (ALE) or atomic layer deposition (ALD) process, wherein a laser beam distribution unit for receiving a pulsed laser beam generated by a laser beam generator and distributing the pulsed laser beam to the plurality of substrate processing apparatuses is provided, and wherein the laser beam distribution unit distributes the pulsed laser beam to laser units of the plurality of substrate processing apparatuses at time intervals.

A plurality of laser beam distribution units may be provided, and each laser beam distribution unit may distribute the pulsed laser beam to the laser units of the same number or a different number of at least two substrate processing apparatuses at time intervals.

One cycle of the thermal ALE or ALD process may be 5 seconds (s) to 60 s, a start timing of the one cycle may be shifted for the substrate processing apparatuses, and the laser beam distribution unit may distribute the pulsed laser beam to the laser units of the substrate processing apparatuses within the one cycle.

According to another aspect of the present invention, there is provided a substrate processing module including a plurality of substrate processing apparatuses used for a thermal atomic layer etching (ALE) or atomic layer deposition (ALD) process, each substrate processing apparatus including a process chamber having a processing space therein, a support unit for supporting a substrate in the processing space, a gas supply unit for supplying a process gas into the processing space, a plasma source for forming plasma from the process gas supplied into the processing space, and a laser unit for heating the substrate by irradiating a pulsed laser beam onto the substrate, wherein the substrate processing module further includes a laser beam generator for generating a pulsed laser beam, and a laser beam distribution unit for receiving the pulsed laser beam from the laser beam generator and distributing the pulsed laser beam to the laser units of the plurality of substrate processing apparatuses at time intervals, wherein one cycle of the thermal ALE or ALD process is 5 seconds (s) to 60 s, wherein a start timing of the one cycle is shifted for the substrate processing apparatuses, and wherein the laser beam distribution unit distributes the pulsed laser beam to the laser units of the substrate processing apparatuses within the one cycle.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
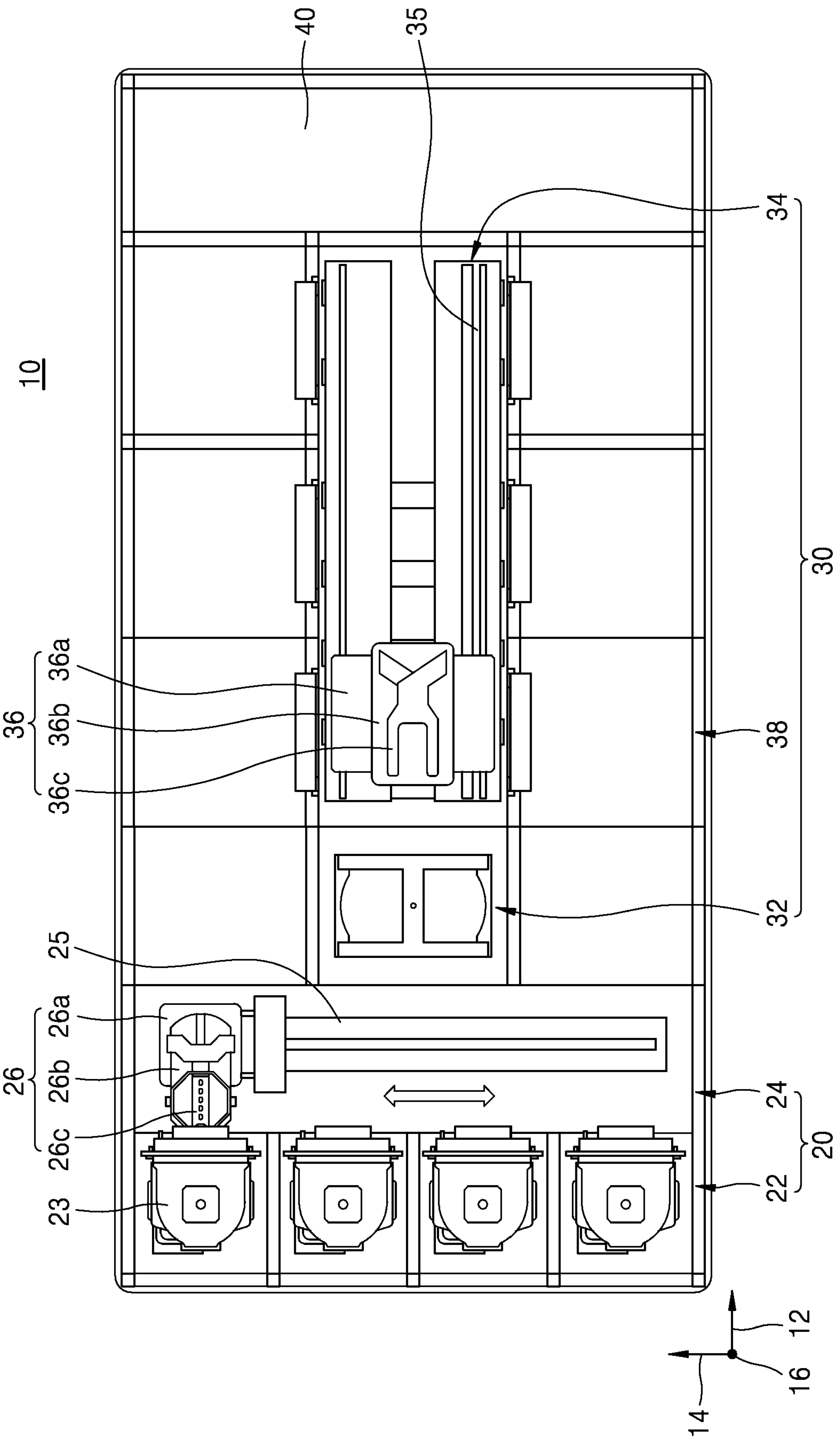
FIG. 1 is a plan view of a substrate processing system according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a plan view of a substrate processing system 10 according to an embodiment of the present invention.

Referring to FIG. 1, the substrate processing system 10 includes an index module 20 and a processing module 30. The substrate processing system 10 further includes a laser beam generator 40. The index module 20 includes load ports 22 and a transfer frame 24. The load ports 22, the transfer frame 24, and the processing module may be sequentially arranged. In this specification, a direction in which the load ports 22, the transfer frame 24, and the processing module 30 are arranged is referred to as a first direction 12 (or an x-axis direction), a direction perpendicular to the first direction 12 when viewed from above is referred to as a second direction 14 (or an y-axis direction), and a direction perpendicular to a plane including the first and second directions 12 and 14 (i.e., an xy plane) is referred to as a third direction 16 (or a z-axis direction).

Carriers 23 containing substrates W are seated on the load ports 22. A plurality of load ports 22 may be disposed along the second direction 14. The number of load ports 22 may increase or decrease depending on process efficiency of the processing module 30, production efficiency, or the like. Each carrier 23 may use a front opening unified pod (FOUP) and include therein slots for holding a plurality of substrates W horizontally.

The processing module 30 includes a buffer unit 32, a transfer chamber 34, and process chambers 38. The transfer chamber 34 may extend parallel to the first direction 12, and the process chambers 38 may be disposed at both sides in a lengthwise direction of the transfer chamber 34. Some of the process chambers 38 may be stacked on one another. Meanwhile, the process chambers 38 may be disposed only at one side of the transfer chamber 34.

The buffer unit 32 is disposed between the transfer frame 24 and the transfer chamber 34 to provide a space where the substrates W stay before being transferred between the transfer frame 24 and the transfer chamber 34. The buffer unit 32 includes therein slots where the substrates W are disposed. The buffer unit 32 may be provided to be open or openable to the transfer frame 24 and the transfer chamber 34.

The transfer frame 24 may transfer the substrates W between the carriers 23 and the buffer unit 32. The transfer frame 24 is provided with an index rail 25 and an index robot 26. The index rail 25 may extend parallel to the second direction 14, and the index robot 26 may be mounted thereon to move along the second direction 14. The index robot 26 includes a base 26*a*, a body 26*b*, and an index arm 26*c*. The base 26*a* is provided to be movable along the index rail 25. The body 26*b* is coupled to the base 26*a* and provided to be rotatable and movable along the third direction 16 on the base 26*a*. The index arm 26*c* is coupled to the body 26*b* and provided to be movable toward or away from the body 26*b*. A plurality of index arms 26*c* may be provided and individually driven. Each index arm 26*c* may be used to transfer the substrate W from the carrier 23 to the processing module 30, or from the processing module 30 to the carrier 23.

The transfer chamber 34 transfers the substrates W between the buffer unit 32 and the process chambers 38 or between the process chambers 38. The transfer chamber 34 is provided with a guide rail 35 and a main robot 36. The guide rail 35 may extend parallel to the first direction 12, and the main robot 36 may be mounted thereon to move along the first direction 12. The main robot 36 includes a base 36*a*, a body 36*b*, and a main arm 36*c*. The base 36*a* is provided to be movable along the guide rail 35. The body 36*b* is coupled to the base 36*a* and provided to be rotatable and movable along the third direction 16 on the base 36*a*. The main arm 36*c* is coupled to the body 36*b* and provided to be movable toward or away from the body 36*b*. A plurality of main arms 36*c* may be provided and individually driven.

Each process chamber 38 is provided with a substrate processing apparatus 50 for performing a process on the substrate W. The substrate processing apparatus 50 may have a different structure depending on the performed process. Meanwhile, the substrate processing apparatuses 50 in all process chambers 38 may have the same structure, or the substrate processing apparatuses 50 in the process chambers 38 belonging to the same group may have the same structure. The substrate processing apparatus 50 performs an etching or deposition process on the substrate W. The number of substrate processing apparatuses 50 may be 6 or 12 in an embodiment of the present invention but may be changed.

The laser beam generator 40 is provided to generate a laser beam L. The laser beam generator 40 may be disposed inside the substrate processing system 10 (or a substrate processing module 10) or disposed outside to transmit the laser beam L through an optical fiber. The laser beam generator 40 is connected through an optical fiber to each process chamber 38 (or a laser unit 600 of each substrate processing apparatus 50). The laser beam generator 40 generates a laser beam L for heating the substrate W. The laser beam L is provided as a pulsed laser beam.

Figure 2:
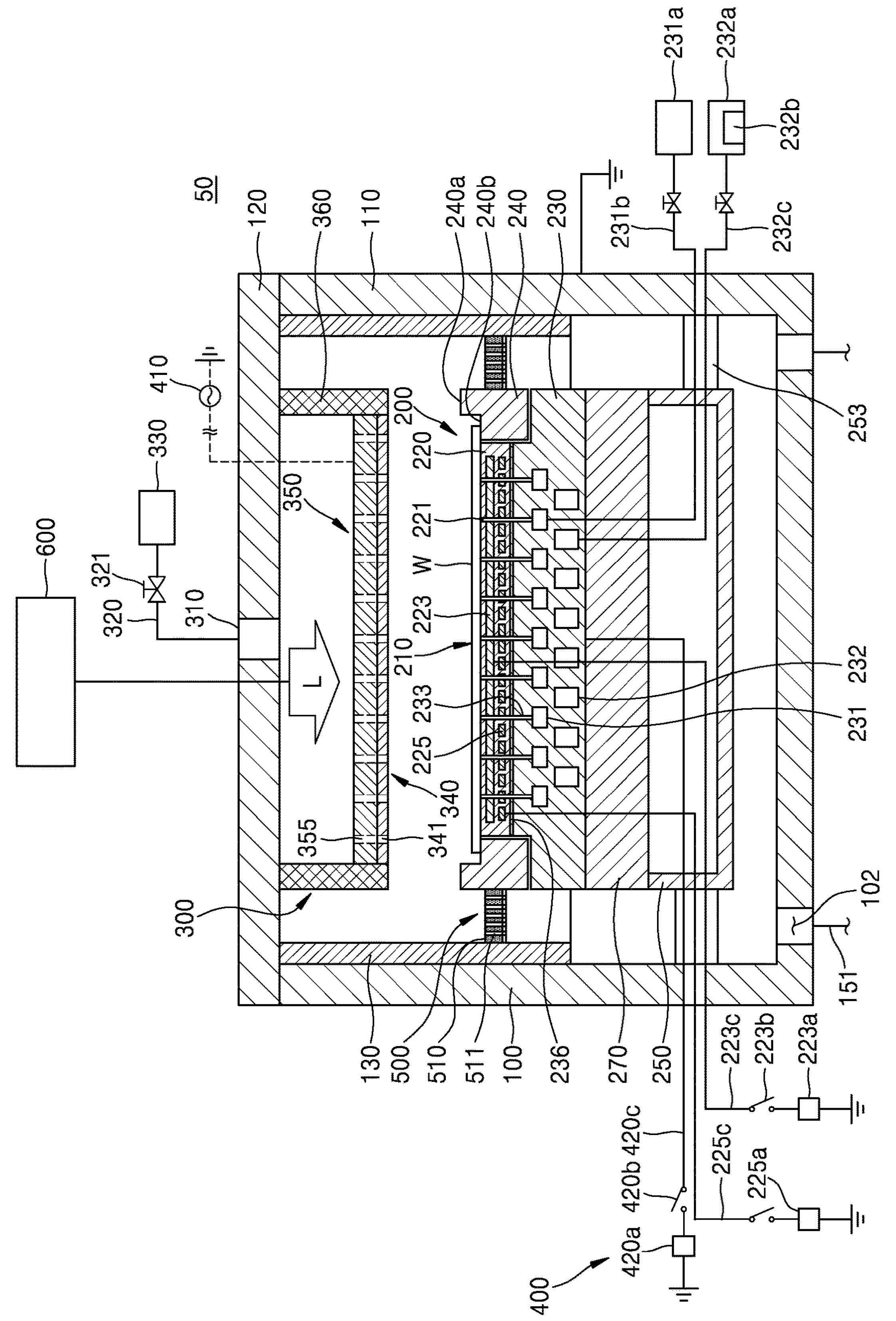
FIG. 2 is a cross-sectional view of a substrate processing apparatus according to an embodiment of the present invention.

FIG. 2 is a cross-sectional view of the substrate processing apparatus 50 according to an embodiment of the present invention.

Referring to FIG. 2, the substrate processing apparatus 50 processes the substrate W by using plasma. For example, the substrate processing apparatus 50 may perform an etching process on the substrate W. The substrate processing apparatus 50 includes a process chamber 100, a support unit 200, a gas supply unit 300, a plasma source 400, a baffle unit 500, and a laser unit 600.

The process chamber 100 provides therein a processing space where the substrate W is processed. The process chamber 100 is provided in a sealed shape having a processing space therein. The process chamber 100 is made of a metal. The process chamber 100 may be made of aluminum (Al). The process chamber 100 may be grounded. Vent holes 102 are provided in a bottom surface of the process chamber 100. The vent holes 102 are connected to vent lines 151. Reaction byproducts produced while processing the substrate W and gases staying in an inner space of the process chamber 100 may be expelled to the outside through the vent lines 151. Due to the expulsion, the inside of the process chamber 100 is reduced to a certain pressure.

According to an example, the process chamber 100 may include a housing 110 having an open top, and a window 120. The housing 110 has a space having an open top. The window 120 covers the open top of the housing 110. The window 120 is provides in a plate shape to seal the inner space of the housing 110. The window 120 may include a dielectric substance. The window 120 may be made of a transparent material through which a laser beam L passes.

According to an example, a liner 130 may be provided in the process chamber 100. The liner 130 has a cylindrical shape having an open top and bottom. The liner 130 may be provided in contact with an inner surface of the process chamber 100. The liner 130 protects and prevents an inner wall of the process chamber 100 from being damaged by arc discharge. The liner 130 also prevents impurities produced while processing the substrate W from being deposited on the inner wall of the process chamber 100. Optionally, the liner 130 may not be provided.

The support unit 200 is provided in the process chamber 100. The support unit 200 supports the substrate W in the processing space. The support unit 200 may include an electrostatic chuck 210 for adsorbing the substrate W by using an electrostatic force.

The support unit 200 includes the electrostatic chuck 210, a lower cover 250, and a plate 270. The support unit 200 is spaced upward from the bottom surface of the process chamber 100 in the process chamber 100.

The electrostatic chuck 210 includes a dielectric plate 220, a body 230, and a focus ring 240. The electrostatic chuck 210 supports the substrate W.

The dielectric plate 220 is positioned on top of the electrostatic chuck 210. The dielectric plate 220 is provided as a disk-shaped dielectric substance. The substrate W is placed on a top surface of the dielectric plate 220. The top surface of the dielectric plate 220 has a radius less than that of the substrate W. Accordingly, an edge region of the substrate W is positioned outside the dielectric plate 220.

The dielectric plate 220 includes a first electrode 223, a heater 225, and first supply channels 221 therein. The first supply channels 221 penetrate from the top surface to a bottom surface of the dielectric plate 220. A plurality of first supply channels 221 are spaced apart from each other and provided as passages through which a heat transfer medium is supplied to a bottom surface of the substrate W.

The first electrode 223 is electrically connected to a first power source 223*a*. The first power source 223*a* includes a direct current (DC) power source. A switch 223*b* is mounted between the first electrode 223 and the first power source 223*a*. The first electrode 223 may be electrically connected to or disconnected from the first power source 223*a* by turning on or off the switch 223*b*. When the switch 223*b* is turned on, a DC current is applied to the first electrode 223. An electrostatic force is generated between the first electrode 223 and the substrate W by the current applied to the first electrode 223, and the substrate W is adsorbed onto the dielectric plate 220 by the electrostatic force.

The heater 225 is positioned under the first electrode 223. The heater 225 is electrically connected to a second power source 225*a*. The heater 225 generates heat by resisting a current applied from the second power source 225*a*. The generated heat is transferred to the substrate W through the dielectric plate 220. The substrate W is maintained at a certain temperature by the heat generated by the heater 225. The heater 225 includes a spiral coil.

The body 230 is positioned under the dielectric plate 220. The bottom surface of the dielectric plate 220 may be bonded to a top surface of the body 230 by an adhesive 236. The body 230 may be made of Al. The top surface of the body 230 may be stepped in such a manner that a central region is higher than an edge region thereof. The central region of the top surface of the body 230 has an area corresponding to and is bonded to the bottom surface of the dielectric plate 220. The body 230 provides a first circulation channel 231, a second circulation channel 232, and second supply channels 233 therein.

The first circulation channel 231 is provided as a passage through which a heat transfer medium circulates. The first circulation channel 231 may be provided in a spiral shape in the body 230. Alternatively, the first circulation channel 231 may be provided as a plurality of ring-shaped channels having different radii and the same center. The first circulation channels 231 may be connected to each other. The first circulation channels 231 are provided at the same height.

The second circulation channel 232 is provided as a passage through which a cooling fluid circulates. The second circulation channel 232 may be provided in a spiral shape in the body 230. Alternatively, the second circulation channel 232 may be provided as a plurality of ring-shaped channels having different radii and the same center. The second circulation channels 232 may be connected to each other. The second circulation channels 232 may have a cross-sectional area greater than that of the first circulation channels 231. The second circulation channels 232 are provided at the same height. The second circulation channels 232 may be positioned under the first circulation channels 231.

The second supply channels 233 extend upward from the first circulation channel 231 to the top surface of the body 230. The second supply channels 233 are provided to correspond to the number of first supply channels 221 and connect the first circulation channel 231 to the first supply channels 221.

The first circulation channel 231 is connected to a heat transfer medium reservoir 231*a* through a heat transfer medium supply line 231*b*. The heat transfer medium reservoir 231*a* stores a heat transfer medium. The heat transfer medium includes an inert gas. According to an embodiment, the heat transfer medium includes a helium (He) gas. The He gas is supplied to the first circulation channel 231 through the heat transfer medium supply line 231*b* and then supplied to the bottom surface of the substrate W sequentially through the second supply channels 233 and the first supply channels 221. The bottom surface of the substrate W may receive heat through the dielectric plate 220 but portions of the bottom surface of the substrate W may not be in close contact with the dielectric plate 220. The heat transfer medium such as the He gas is supplied into fine gaps between the bottom surface of the substrate W and the dielectric plate 220 to uniformly transfer heat to the entirety of the bottom surface of the substrate W.

The second circulation channel 232 is connected to a cooling fluid reservoir 232*a* through a cooling fluid supply line 232*c*. The cooling fluid reservoir 232*a* stores a cooling fluid. A cooler 232*b* may be provided in the cooling fluid reservoir 232*a*. The cooler 232*b* cools the cooling fluid to a certain temperature. Unlike this, the cooler 232*b* may be mounted on the cooling fluid supply line 232*c*. The cooling fluid supplied to the second circulation channel 232 through the cooling fluid supply line 232*c* circulates along the second circulation channel 232 and cools the body 230. When the body 230 is cooled, the dielectric plate 220 and the substrate W may also be cooled to maintain the substrate W at a certain temperature.

The body 230 may include a metal plate. According to an example, the entirety of the body 230 may be provided as a metal plate. The body 230 may be electrically connected to a lower power source 420. The lower power source 420 may be provided as a high-frequency power source for generating high-frequency power. The high-frequency power source may be provided as a radio-frequency (RF) power source. The body 230 receives high-frequency power from the lower power source 420. As such, the body 230 may function as an electrode.

The focus ring 240 is disposed on an edge region of the electrostatic chuck 210. The focus ring 240 has a ring shape and is disposed along the circumference of the dielectric plate 220. A top surface of the focus ring 240 may be stepped in such a manner that an outer portion 240*a* is higher than an inner portion 240*b* thereof. The inner portion 240*b* of the top surface of the focus ring 240 is positioned at the same height as the top surface of the dielectric plate 220. The inner portion 240*b* of the top surface of the focus ring 240 supports the edge region of the substrate W positioned outside the dielectric plate 220. The outer portion 240*a* of the focus ring 240 is provided to surround the edge region of the substrate W.

The lower cover 250 is positioned at the bottom of the support unit 200. The lower cover 250 is spaced upward from the bottom surface of the process chamber 100. An inner space 255 having an open top is provided in the lower cover 250. An outer radius of the lower cover 250 may be the same as the outer radius of the body 230. For example, a lift pin module (not shown) for moving the substrate W from an external transfer member onto the electrostatic chuck 210 may be positioned in the inner space 255 of the lower cover 250. The lift pin module (not shown) is spaced apart from the lower cover 250 by a certain distance. A bottom surface of the lower cover 250 may be made of a metal.

The lower cover 250 has connecting members 253. The connecting members 253 connect an outer surface of the lower cover 250 to the inner wall of the process chamber 100. A plurality of connecting members 253 may be provided on the outer surface of the lower cover 250 at regular intervals. The connecting members 253 support the support unit 200 in the process chamber 100. In addition, the connecting members 253 are connected to the inner wall of the process chamber 100 to electrically ground the lower cover 250. A first power source line 223*c* connected to the first power source 223*a*, a second power source line 225*c* connected to the second power source 225*a*, a third power source line 420*c* connected to the lower power source 420, the heat transfer medium supply line 231*b* connected to the heat transfer medium reservoir 231*a*, and the cooling fluid supply line 232*c* connected to the cooling fluid reservoir 232*a* extend into the inner space of the lower cover 250 through the connecting members 253.

The plate 270 is positioned between the electrostatic chuck 210 and the lower cover 250. The plate 270 covers a top surface of the lower cover 250. The plate 270 has a cross-sectional area corresponding to the body 230. The plate 270 may include an insulator.

The gas supply unit 300 supplies a process gas into the process chamber 100. The gas supply unit 300 includes a gas supply nozzle 310, a gas supply line 320, a gas reservoir 330, a shower head 340, an electrode plate 350, and a supporter 360.

The gas supply nozzle 310 is mounted at a central portion of a top surface of the process chamber 100. An injector is provided on a bottom surface of the gas supply nozzle 310. The injector supplies the process gas into the process chamber 100. The gas supply line 320 connects the gas supply nozzle 310 to the gas reservoir 330. The gas supply line 320 supplies, to the gas supply nozzle 310, the process gas stored in the gas reservoir 330. A valve 321 is mounted on the gas supply line 320. The valve 321 opens or closes the gas supply line 320 to control a flow rate of the process gas supplied through the gas supply line 320.

The shower head 340 is positioned above the support unit 200 in the process chamber 100. The shower head 340 is positioned to face the support unit 200. The shower head 340 is provided with injection holes 341. The injection holes 341 penetrate from a top surface to a bottom surface of the shower head 340 in a vertical direction. The process gas may pass through the injection holes 341. The shower head 340 may be made of silicon (Si). Alternatively, the shower head 340 may be made of an insulator.

The electrode plate 350 is provided on the shower head 340. The shower head 340 is spaced downward from the top surface of the process chamber 100 by a certain distance. A certain space is formed between the electrode plate 350 and the top surface of the process chamber 100.

The electrode plate 350 controls a density of an electric field in the process chamber 100. A bottom surface of the electrode plate 350 may be anodized to prevent arcing due to plasma. A cross-section of the electrode plate 350 may be provided to have the same shape and cross-sectional area as the support unit 200. The electrode plate 350 includes a plurality of injection holes 355. The process gas may pass through the injection holes 355. The injection holes 355 of the electrode plate 350 may be connected to the injection holes 341 of the shower head 340. The electrode plate 350 includes a metal. The electrode plate 350 may be electrically connected to an upper power source 410. The upper power source 410 may be provided as a high-frequency power source. Unlike this, the electrode plate 350 may be electrically grounded. The electrode plate 350 may be electrically connected to the upper power source 410 or grounded to function as an electrode.

The supporter 360 supports sides of the shower head 340 and the electrode plate 350. An upper end of the supporter 360 is connected to the top surface of the process chamber 100, and a lower end thereof is connected to the sides of the shower head 340 and the electrode plate 350. The supporter 360 may include a non-metal.

The plasma source 400 excites the process gas in the process chamber 100 to a plasma state. In an embodiment of the present invention, a capacitively coupled plasma (CCP) is used as the plasma source 400. The CCP may include an upper electrode and a lower electrode. The upper and lower electrodes may be disposed horizontally and parallel to each other in the process chamber 100. The plasma source 400 may include the upper power source 410 and the lower power source 420, and the upper power source 410 may correspond to the upper electrode and the lower power source 420 may correspond to the lower electrode. The upper power source 410 may apply high-frequency power to the upper electrode, and the lower power source 420 may apply high-frequency power to the lower electrode. According to an example, the upper electrode may be provided as the electrode plate 350 and the lower electrode may be provided as the body 230. A generated electromagnetic field excites the process gas provided into the process chamber 100, to a plasma state.

The baffle unit 500 is positioned between the inner wall of the process chamber 100 and the support unit 200. A baffle 510 is provided in a circular ring shape. A plurality of through holes 511 are provided in the baffle 510. The process gas provided into the process chamber 100 passes through the through holes 511 of the baffle 510 and is expelled through the vent holes 102. The flow of the process gas may be controlled according to the shape of the baffle 510 and the shape of the through holes 511.

The laser unit 600 provides a laser beam L for heating the substrate W. The laser unit 600 may irradiate, onto the substrate W, the laser beam L received from the laser beam generator 40. The laser unit 600 may be provided to include an optical fiber. The laser unit 600 may be disposed inside or outside the process chamber 100 to irradiate the received laser beam L into the process chamber 100. The laser beam L may pass through the window 120, the upper electrode (or the electrode plate 350), etc. and be irradiated onto the substrate W. To pass the laser beam L, the upper electrode and/or the lower electrode may be provided as a transparent electrode.

A procedure of processing the substrate W by using the above-described substrate processing apparatus 50 is as follows. Although a thermal atomic layer etching (ALE) process is described below as an example, the substrate processing apparatus 50 is also applicable to a thermal atomic layer deposition (ALD) process.

When the substrate W is placed on the support unit 200, a DC current is applied from the first power source 223*a* to the first electrode 223. An electrostatic force is generated between the first electrode 223 and the substrate W by the DC current applied to the first electrode 223, and the substrate W is adsorbed onto the electrostatic chuck 210 by the electrostatic force.

When the substrate W is adsorbed onto the electrostatic chuck 210, a process gas is supplied into the process chamber 100 through the gas supply nozzle 310. To rapidly heat the substrate W, a pulsed laser beam L is transmitted from the laser beam generator 40 to the laser unit 600 and irradiated onto the substrate W. The heated surface of the substrate W may react with the process gas. For example, chlorine molecules in a chlorine ($Cl_2$) process gas may attach to and react with the Si surface. When the reaction between the process gas and the substrate W is completed, the process gas is expelled through the baffle unit 500.

Thereafter, high-frequency power generated by the lower power source 420 is applied to the body 230 provided as a lower electrode. To the electrode plate 350 provided as an upper electrode, high-frequency power is applied by the upper power source 410. An electric field is generated between the body 230 and the electrode plate 350 and plasma is formed from the gas. The plasma is provided onto the substrate W to process the substrate W. The plasma may perform an etching process. Because the surface of the substrate W has a weakened bonding force due to the reaction with the process gas, a weakly bonded atomic layer on the surface may be removed through etching. By repeating the above procedure to perform etching per atomic layer, a desired pattern may be accurately formed.

In this specification, a series of procedures including supplying a process gas into the process chamber 100, heating the substrate W by using the laser beam L, causing reaction between the process gas and the surface of the substrate W and expelling the process gas, and forming plasma to perform an etching process is referred to as one cycle of a thermal ALE process. The one cycle may also be applied to a thermal ALD process, and etching in the thermal ALE process may be replaced by deposition per atomic layer in the thermal ALD process.

Figure 3:
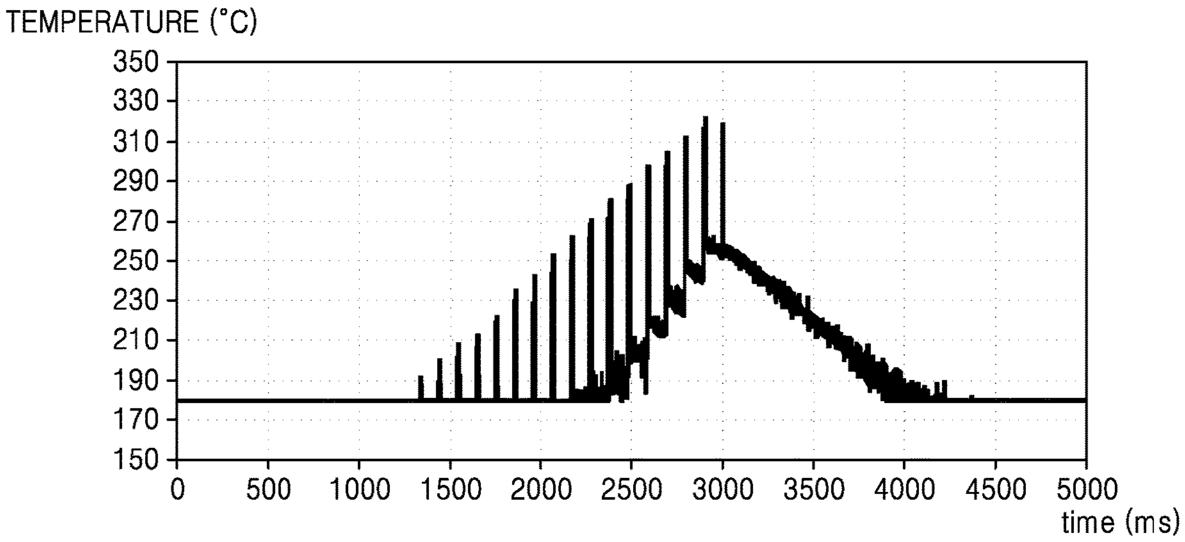
FIG. 3 is a graph showing temperature changes of a substrate heated using a pulsed laser beam, according to an embodiment of the present invention.
Figure 4:
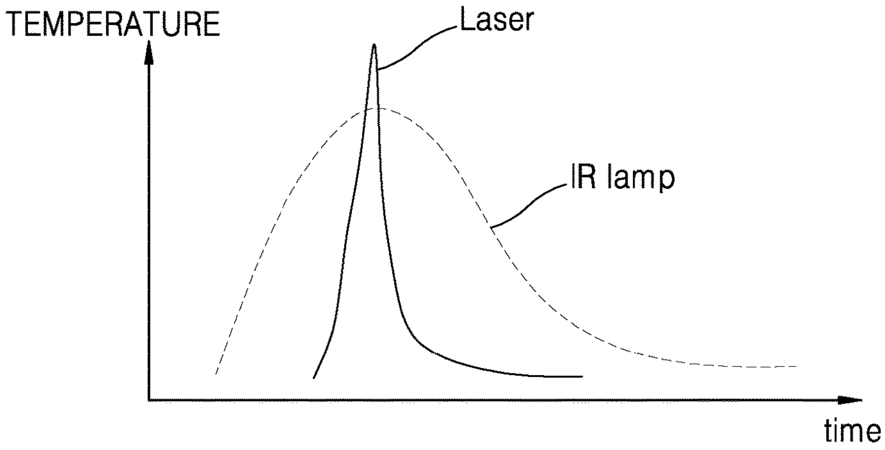
FIG. 4 is a graph showing temperature changes of substrates heated using an infrared (IR) lamp and a laser.

FIG. 3 is a graph showing temperature changes of a substrate heated using a pulsed laser beam, according to an embodiment of the present invention. FIG. 4 is a graph showing temperature changes of substrates heated using an infrared (IR) lamp and a laser.

To allow a process gas to react on the surface of the substrate W, the substrate W may be heated to about 300° C. to about 400° C. The laser unit 600 may irradiate a pulsed laser beam L onto the substrate W. Because the pulsed laser beam L has a power of several to several tens of kW, the entire surface of the substrate W may be heated by each pulse.

Referring to FIG. 3, temperature changes of the substrate W heated using the pulsed laser beam L having a pulse width of about 10 ms are shown. The temperature of the substrate W is rapidly increased while the pulsed laser beam L is being irradiated. The substrate W is rapidly increased in temperature during one pulse of irradiation of the laser beam L, and then cooled and rapidly decreased in temperature during an off time between pulses. When the pulse is repeated to irradiate the laser beam L, the temperature of the substrate W may be gradually increased while repeating rapid increases and decreases.

Referring to FIG. 4, when a substrate is heated using an IR lamp, heat energy is continuously provided and thus the substrate is slowly increased in temperature. In addition, the substrate may be slowly cooled. Because temperature increase and decrease periods of the substrate are long, a total process time of a thermal ALE or ALD process is increased. Therefore, according to the present invention, a substrate is heated using a pulsed laser beam L. When the pulsed laser beam L is used, the temperature of the substrate may be increased within a short time and thus a process time may be reduced and damage due to heat of an apparatus may be minimized.

Figure 5:
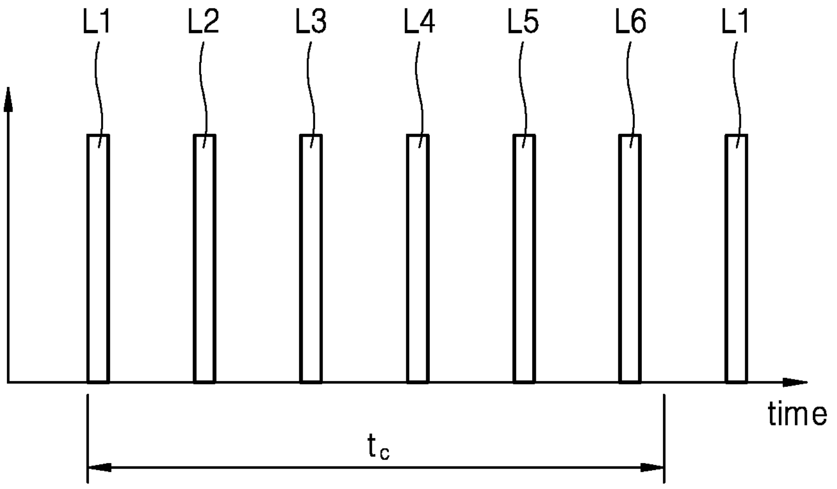
FIG. 5 is a graph showing distribution of a laser beam to a plurality of substrate processing apparatuses, according to an embodiment of the present invention.
Figure 6:
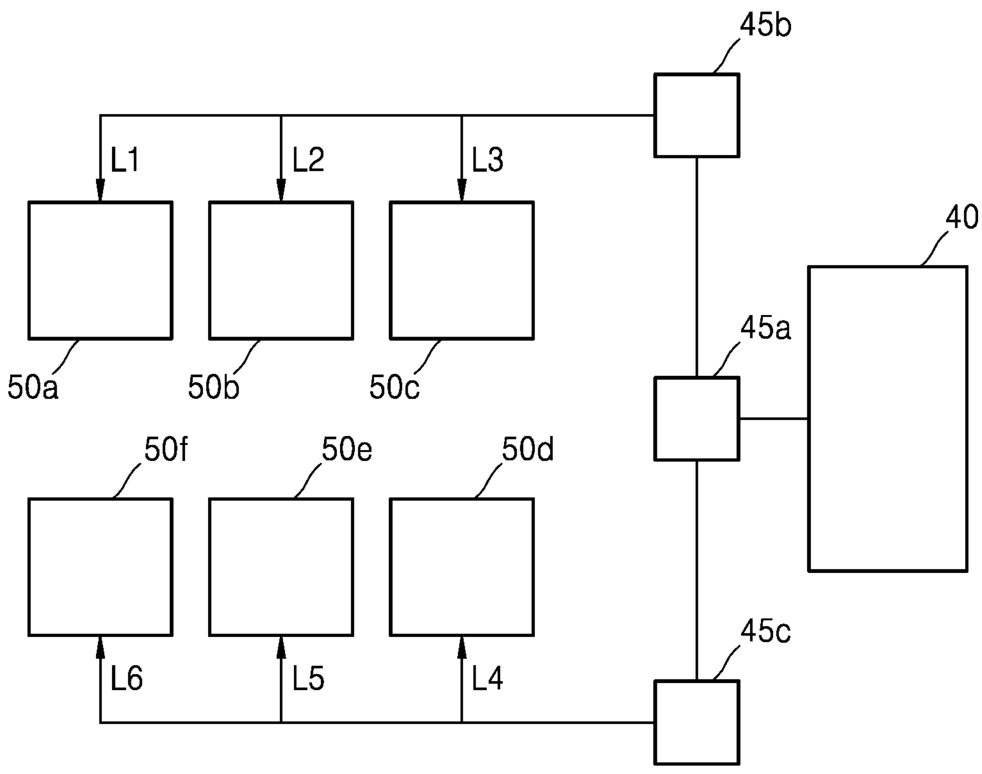
FIGS. 6 to 8 are schematic views showing how to distribute a laser beam to a plurality of substrate processing apparatuses, according to various embodiments of the present invention.
Figure 7:
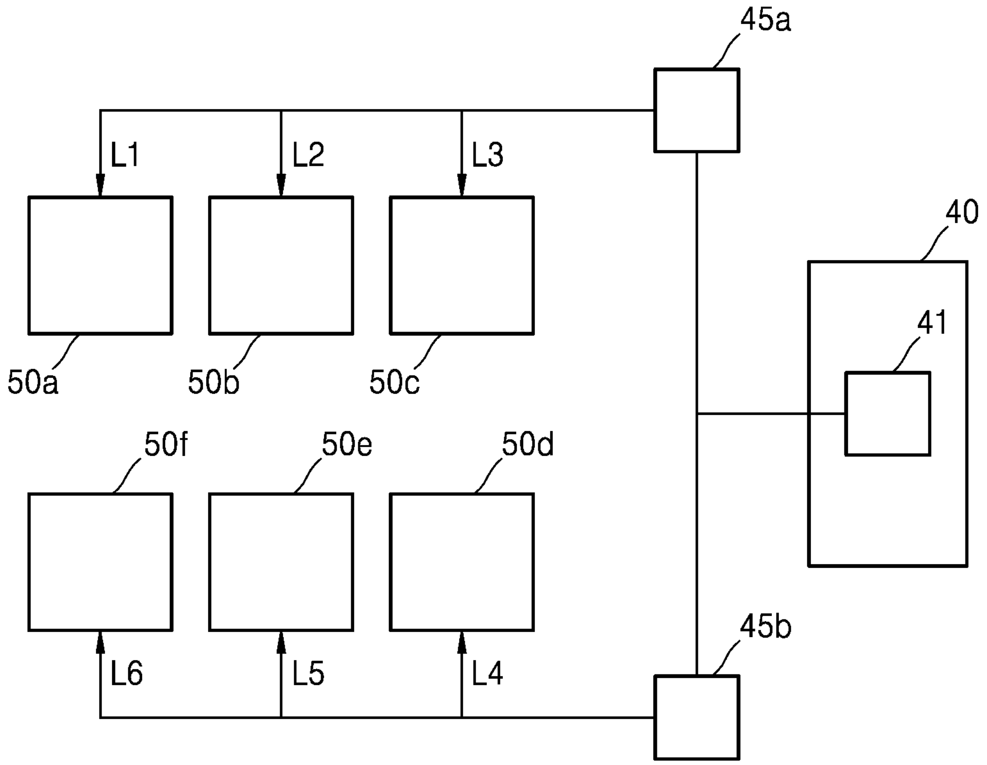
Figure 8:
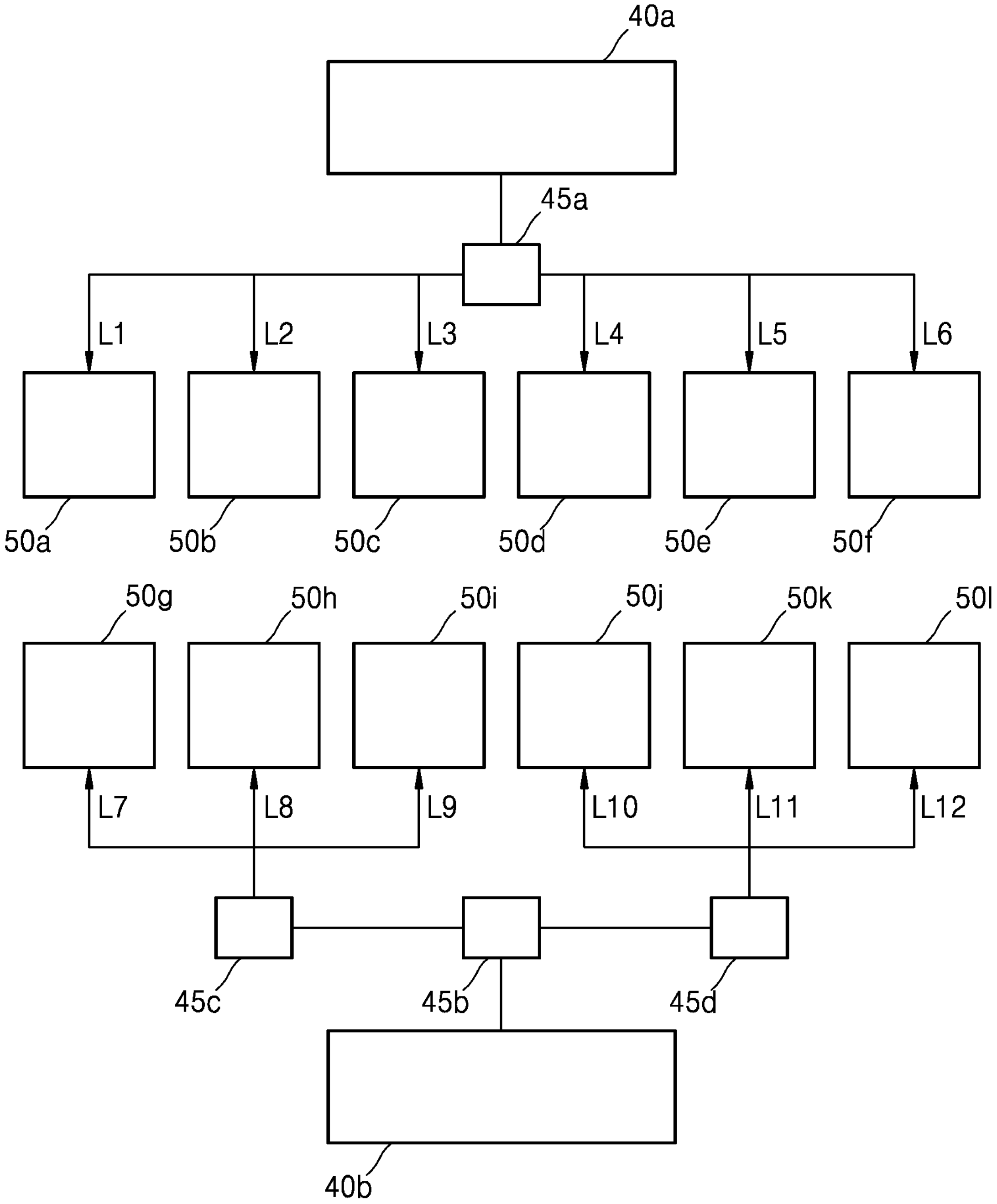

FIG. 5 is a graph showing distribution of a laser beam to a plurality of substrate processing apparatuses 50, according to an embodiment of the present invention. FIGS. 6 to 8 are schematic views showing how to distribute a laser beam to a plurality of substrate processing apparatuses 50, according to various embodiments of the present invention.

Referring to FIGS. 5 and 6, the laser units 600 of the substrate processing apparatuses 50: 50*a* to 50*f* may respectively irradiate pulsed laser beams L1 to L6 onto the substrates W. When the number of substrate processing apparatuses 50 is six, for example, the first substrate processing apparatus 50*a* may irradiate the pulsed laser beam L1, the second substrate processing apparatus 50*b* may irradiate the pulsed laser beam L2, and the third substrate processing apparatus 50*c* may irradiate the pulsed laser beam L3 onto the substrate W. In this case, the laser beams L1 to L6 may be irradiated from one laser beam generator 40 onto a plurality of substrate processing apparatuses 50*a* to 50*f*.

Because the laser beam generator 40 for generating a laser beam having a power of several to several tens of kW is very high-priced, mounting the laser beam generator 40 one to one on each of the substrate processing apparatuses 50*a* to 50*f* is disadvantageous in terms of cost. Therefore, the present invention is characterized in that one or a small number of laser beam generators 40 are used to provide laser beams to a number of substrate processing apparatuses 50 greater than the number of laser beam generators 40. A laser beam generated by the laser beam generator 40 may be distributed by laser beam distribution units 45: 45*a*, 45*b*, and 45*c* and transmitted to the substrate processing apparatuses 50*a* to 50*f* at time intervals.

A pulsed laser beam generated by the laser beam generator 40 and irradiated onto the substrate W is much shorter than a time $t_c$ of one cycle of a thermal ALE or ALD process. According to an embodiment, the time $t_c$ of one cycle of the thermal ALE or ALD process is about 5 seconds (s) to about 60 s. A pulse period of the pulsed laser beam corresponds to about 1 nanosecond (ns) to about 100 milliseconds (ms). In the graph of FIG. 5, the interval between bars of the pulsed laser beams L1 to L6 corresponds to about 1 ns to about 100 ms. Eventually, because the time taken to irradiate the pulsed laser beam onto one substrate processing apparatus 50 is much shorter than the time $t_c$ of one cycle of the entire process, the pulsed laser beam generated by the laser beam generator 40 may be temporally shared.

From another point of view, the time $t_c$ of one cycle may be longer than [the time taken to irradiate the pulsed laser beam L1 onto one substrate processing apparatus 50*a*]×[the number of substrate processing apparatuses 50*a* to 50*f*].

The pulsed laser beam L1 generated by the laser beam generator 40 may be initially provided to the first substrate processing apparatus 50*a*. The pulsed laser beam L2 generated by the laser beam generator 40 after a certain time may be provided to the second substrate processing apparatus 50*b*. By repeating the above procedure, the pulsed laser beams L1 to L6 may be sequentially provided to the six substrate processing apparatuses 50*a* to 50*f*. The time and period for irradiating the pulsed laser beams L1 to L6 are very short and thus have little effect on one cycle of the process.

According to an embodiment, the pulsed laser beams L1 to L6 may have the same pulse width. Alternatively, the pulsed laser beams L1 to L6 may have the same pulse period. As such, the pulsed laser beams L1 to L6 may be sequentially generated by the laser beam generator 40 and irradiated onto the substrate processing apparatuses 50*a* to 50*f* without overlapping. However, the pulse width or the pulse period does not need to be the same as long as the pulsed laser beams L1 to L6 may be sequentially irradiated onto the substrate processing apparatuses 50*a* to 50*f* at time intervals. Although one pulse of a laser beam is irradiated onto each of the substrate processing apparatuses 50*a* to 50*f* in FIG. 5, a plurality of pulses of the laser beam may be irradiated onto each substrate processing apparatus as long as the laser beam is distributed to all substrate processing apparatuses 50*a* to 50*f* within the time $t_c$ of one cycle.

The pulsed laser beams L1 to L6 may have the same pulse width and pulse period. A start timing of one cycle of a thermal ALE or ALD process may be shifted for the substrate processing apparatuses 50*a* to 50*f*. For example, an interval between the start timing of one cycle of the first substrate processing apparatus 50*a* and the start timing of one cycle of the second substrate processing apparatus 50*b* may correspond to an interval between irradiation timings of the first and second pulsed laser beams L1 and L2. The interval between the irradiation timings of the first and second pulsed laser beams L1 and L2 generated by the laser beam generator 40, i.e., a time between pulses, may be the shortest period within preset power of the first and second pulsed laser beams L1 and L2.

Referring back to FIG. 6, it is shown that the pulsed laser beams L1 to L6 are distributed from one laser beam generator 40 to six substrate processing apparatuses 50*a* to 50*f* by the laser beam distribution units 45: 45*a* to 45*c*. One or more laser beam distribution units 45 may be used.

The first laser beam distribution unit 45*a* connected to the laser beam generator through an optical fiber may transmit a received laser beam to the second or third laser beam distribution unit 45*b* or 45*c*. When the first laser beam distribution unit 45*a* initially transmits the laser beam to the second laser beam distribution unit 45*b*, the second laser beam distribution unit 45*b* may transmit the pulsed laser beams L1, L2, and L3 one pulse (or a plurality of pulses) at a time in the order of the first, second, and third substrate processing apparatuses 50*a*, 50*b*, and 50*c*. Then, the first laser beam distribution unit 45*a* may transmit the laser beam to the third laser beam distribution unit 45*c*, and the third laser beam distribution unit 45*c* may transmit the pulsed laser beams L4, L5, and L6 one pulse (or a plurality of pulses) at a time in the order of the fourth, fifth, and sixth substrate processing apparatuses 50*d*, 50*e*, and 50*f*. The substrate processing apparatuses 50*a* to 50*f* may receive the pulsed laser beams L1 to L6 at time intervals to individually perform a cycle of a thermal ALE or ALD process.

Referring to FIG. 7, according to another embodiment, a laser beam distribution unit 41 may be included in the laser beam generator 40. A laser beam generated by the laser beam generator 40 may be directly distributed by the laser beam distribution unit 41 to a first laser beam distribution unit 45*a* and a second laser beam distribution unit 45*b* at time intervals. A procedure in which the laser beam distributed to the first and second laser beam distribution units 45*a* and 45*b* is distributed to the substrate processing apparatuses 50*a* to 50*f* is the same as that described above in relation to FIG. 6.

The laser beam generator 40 may distribute the laser beam to at least two substrate processing apparatuses 50 among the plurality of substrate processing apparatuses 50 without distributing the laser beam to all substrate processing apparatuses 50. When some substrate processing apparatuses 50 require maintenance/repair or a different process, the laser beam generator 40 may distribute the laser beam only to the other substrate processing apparatuses 50.

Referring to FIG. 8, according to another embodiment, the substrate processing system 10 may include two laser beam generators 40: 40*a* and 40*b* and twelve substrate processing apparatuses 50*a* to 50*l*. The two laser beam generators 40: 40*a* and 40*b* may distribute laser beams to the same or different substrate processing apparatuses 50: 50*a* to 50*l*. FIG. 8 shows that each of the laser beam generators 40: 40*a* and 40*b* distributes a laser beam to six substrate processing apparatuses 50. When two or more laser beam generators 40: 40*a* and 40*b* are included, although any one laser beam generator 40 has an error, the other laser beam generator 40 may be used to perform a thermal ALE or ALD process and thus process stability may be increased.

For example, the first laser beam generator 40*a* may distribute pulsed laser beams L1 to L6 to first to sixth substrate processing apparatuses 50*a* to 50*f* at time intervals by using a first laser beam distribution unit 45*a*. As another example, the second laser beam generator 40*b* may distribute pulsed laser beams L7 to L12 to seventh to twelfth substrate processing apparatuses 50*g* to 50*l* at time intervals by using second to fourth laser beam distribution units 45*b* to 45*d*.

Figure 9:
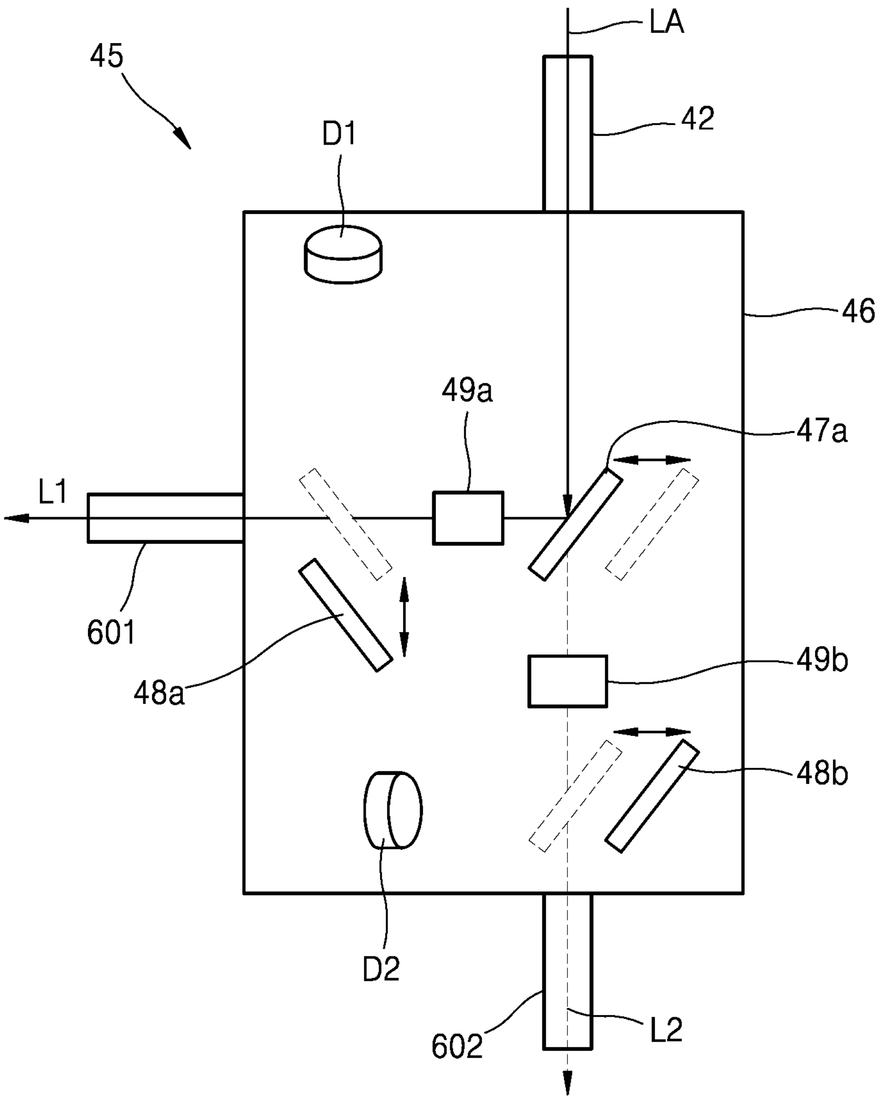
FIGS. 9 and 10 are schematic views showing internal configurations of a laser beam distribution unit, according to various embodiments of the present invention.
Figure 10:
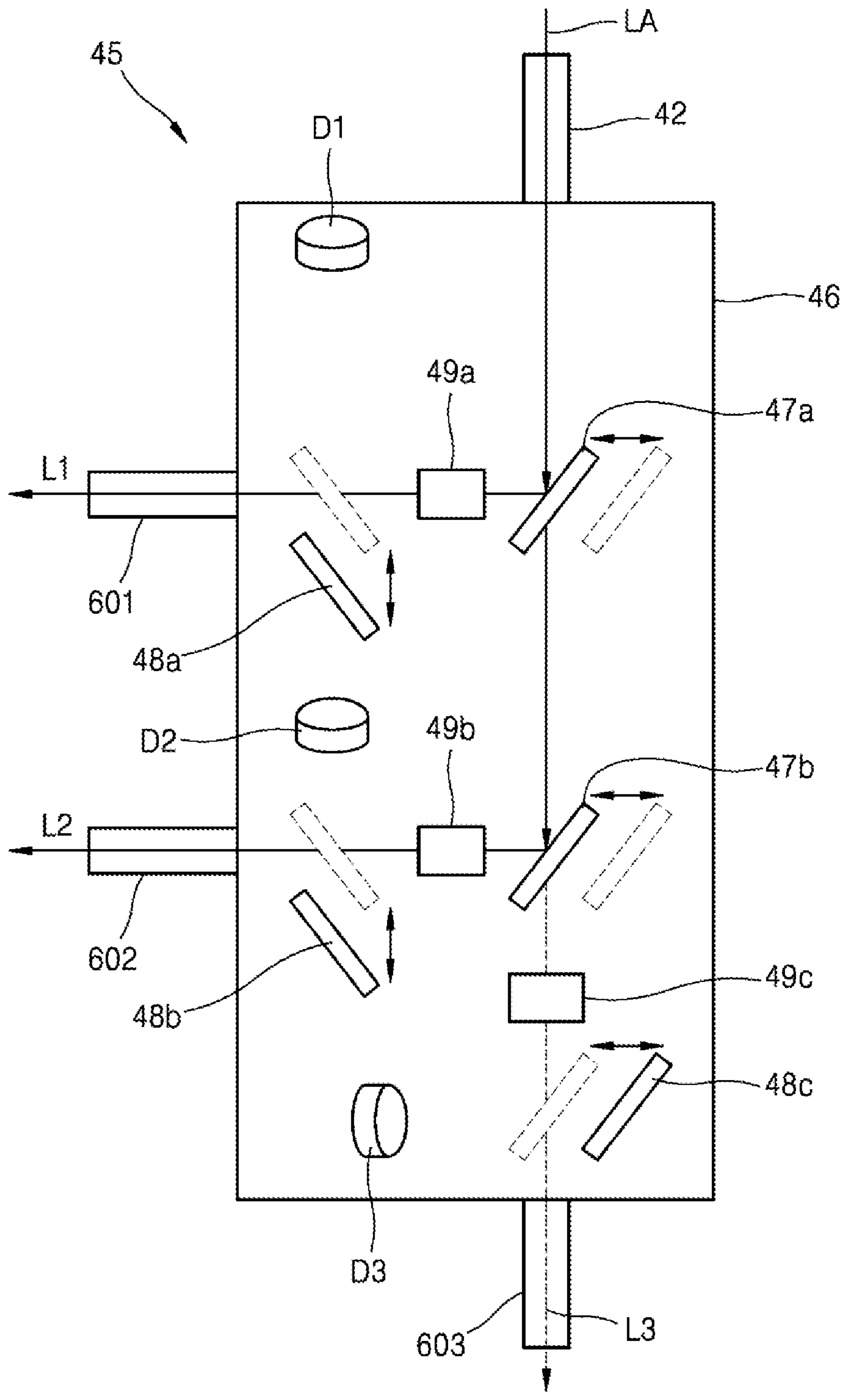

FIGS. 9 and 10 are schematic views showing internal configurations of the laser beam distribution unit 45, according to various embodiments of the present invention.

Referring to FIG. 9, the laser beam distribution unit 45 may include a module housing 46 and a distribution member 47: 47*a*. The laser beam distribution unit 45 may further include shield members 48: 48*a* and 48*b*.

The module housing 46 is a body of the laser beam distribution unit 45 and provides a space where other elements are accommodated. The module housing 46 may be connected to an incident part 42 and supply parts 601 and 602.

The incident part 42 provides a path along which an incident laser beam LA generated by the laser beam generator 40 is transmitted to the laser beam distribution unit 45. The incident part 42 may be provided to include an optical fiber. The supply parts 601 and 602 may allow pulsed laser beams L1 and L2 distributed by the laser beam distribution unit 45, to be irradiated into the process chambers 100 of the laser units 600 of the substrate processing apparatuses 50: 50*a* and 50*b*, respectively. The number of supply parts 601 and 602 may be the same as the number of substrate processing apparatuses 50: 50*a* and 50*b* to be connected to the laser beam distribution unit 45. Like the incident part 42, each of the supply parts 601 and 602 may also be provided to include an optical fiber.

The distribution member 47: 47*a* may allow the laser beam LA incident on the distribution member 47: 47*a* to proceed along a first path or a second path. The first path may correspond to the supply part 601, and the second path may correspond to the supply part 602. When N supply parts 601 and 602 are connected to the laser beam distribution unit 45, N−1 distribution members 47: 47*a* may be provided. The distribution member 47: 47*a* may be positioned on a path of the incident laser beam LA supplied to the laser beam distribution unit 45 through the incident part 42. The distribution member 47: 47*a* may distribute the incident laser beam LA to proceed along the first path toward the first supply part 601 or the second path toward the second supply part 602.

The distribution member 47: 47*a* may be provided as a mirror that totally reflects the incident laser beam LA to the first or second path. To heat the substrate W, the laser beam generator 40 needs to generate an incident laser beam LA having a power of several to several tens of kW. As such, the incident laser beam LA may be totally reflected and supplied to one substrate processing apparatus 50. The incident laser beam LA may be distributed to the first path and transmitted to the first substrate processing apparatus 50*a* as the first pulsed laser beam L1, or distributed to the second path and transmitted to the second substrate processing apparatus 50*b* as the second pulsed laser beam L2.

Meanwhile, the laser beam generator 40 may generate a laser beam having a power of several hundreds of kW, the distribution member 47 may split the incident laser beam LA at a certain ratio and provide the split laser beams to the first and second supply parts 601 and 602.

The first pulsed laser beam L1 reflected from the distribution member 47: 47*a* is provided to proceed to the first supply part 601. In the direction of the first pulsed laser beam L1, the first shield member 48: 48*a* may be provided to be positioned between the distribution member 47: 47*a* and the first supply part 601. The first shield member 48: 48*a* may be provided to be movable outward from the direction of the first pulsed laser beam L1, so as to or not to allow the first pulsed laser beam L1 to proceed to the substrate processing apparatus 50*a* through the first supply part 601. For example, the first shield member 48: 48*a* may be provided in the form of a lens that changes the direction of the first pulsed laser beam L1 by reflecting or refracting the first pulsed laser beam L1, and a first dump D1 may be positioned in the direction of the first pulsed laser beam L1, which is changed by the first shield member 48: 48*a*, to absorb the first pulsed laser beam L1.

Optionally, a first attenuator 49: 49*a* may be positioned on the path of the first pulsed laser beam L1. The first attenuator 49: 49*a* may attenuate the first pulsed laser beam L1 to a set rate before proceeding to the first supply part 601.

When the distribution member 47: 47*a* does not reflect or distribute the incident laser beam LA to the first supply part 601, the incident laser beam LA is provided to proceed to the second supply part 602. In the direction of the second pulsed laser beam L2, the second shield member 48: 48*b* may be provided to be positioned between the distribution member 47: 47*a* and the second supply part 602. The second shield member 48: 48*b* may be provided to be movable outward from the direction of the second pulsed laser beam L2, so as to or not to allow the second pulsed laser beam L2 to proceed to the substrate processing apparatus 50*b* through the second supply part 602. For example, the second shield member 48: 48*b* may be provided in the form of a lens that changes the direction of the second pulsed laser beam L2 by reflecting or refracting the second pulsed laser beam L2, and a second dump D2 may be positioned in the direction of the second pulsed laser beam L2, which is changed by the second shield member 48: 48*b*, to absorb the second pulsed laser beam L2.

Optionally, a second attenuator 49: 49*b* may be positioned on the path of the second pulsed laser beam L2. The second attenuator 49: 49*b* may attenuate the second pulsed laser beam L2 to a set rate before proceeding to the second supply part 602.

Referring to FIG. 10, the laser beam distribution unit 45 according to another embodiment may include a plurality of distribution members 47: 47*a* and 47*b*. The plurality of distribution members 47: 47*a* and 47*b* may allow the incident laser beam LA to proceed along a first path, a second path, or a third path. The first path may correspond to a first supply part 601, the second path may correspond to a second supply part 602, and the third path may correspond to a third supply part 603.

The first distribution member 47*a* may distribute the incident laser beam LA to proceed along the first path toward the first supply part 601 or the second path toward the third supply part 603. When the first distribution member 47*a* does not reflect or distribute the incident laser beam LA to the first supply part 601, the incident laser beam LA proceeds to the second distribution member 47*b*. The second distribution member 47*b* may distribute the incident laser beam LA to proceed along the third path toward the second supply part 602 or the second path toward the third supply part 603.

Optionally, first, second, and third shield members 48: 48*a*, 48*b*, and 48*c*, first, second, and third dumps D1, D2, and D3, and first, second, and third attenuators 49: 49*a*, 49*b*, and 49*c* may be positioned on paths of first, second, and third pulsed laser beams L1, L2, and L3 as described above in relation to FIG. 9.

Figure 11:
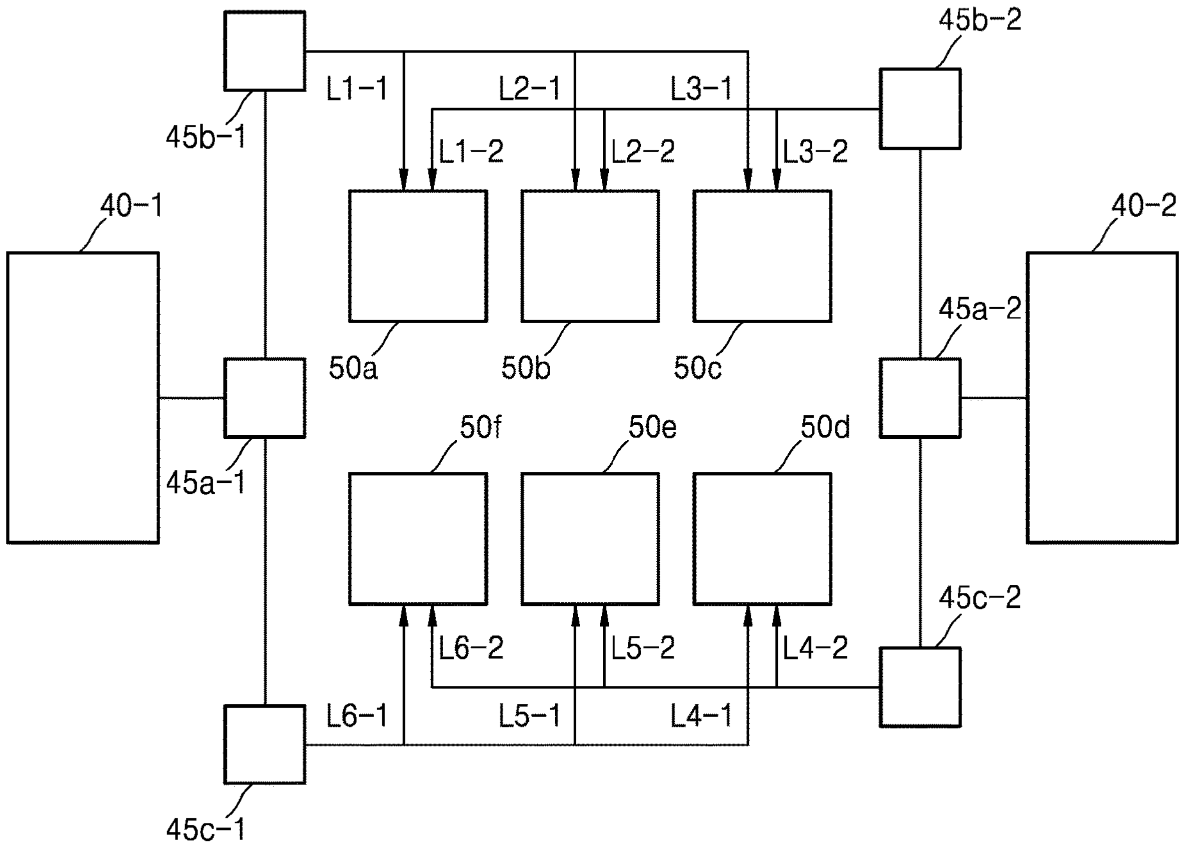
FIG. 11 is a schematic view showing how to distribute a laser beam to heat a substrate by using a plurality of pulsed laser beams, according to another embodiment of the present invention.
Figure 12:
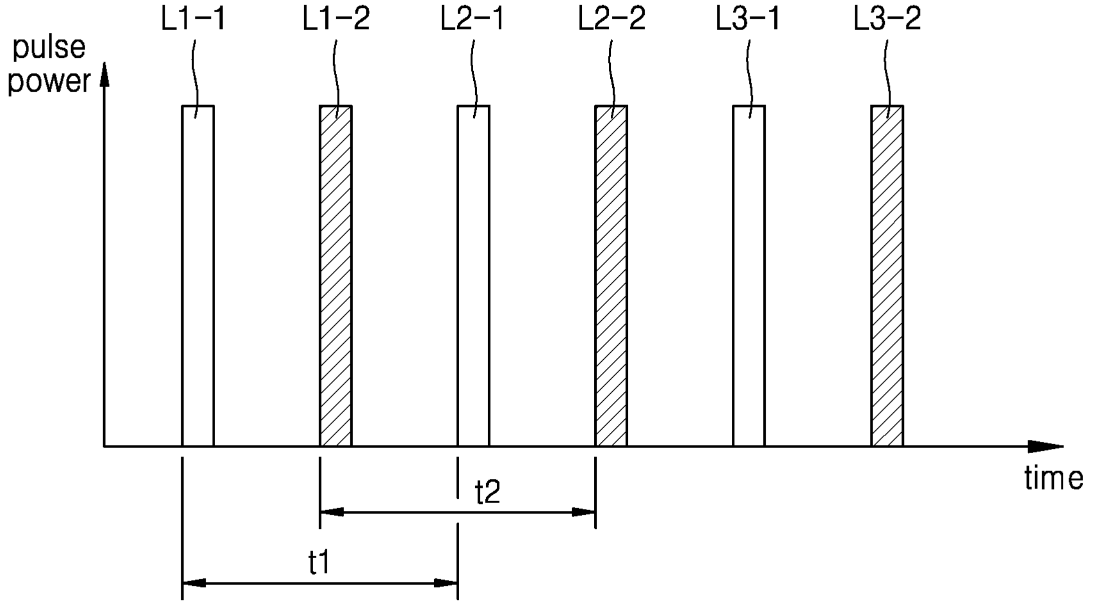
FIG. 12 is a graph showing that a plurality of pulsed laser beams are used to heat a substrate, according to another embodiment of the present invention.

FIG. 11 is a schematic view showing how to distribute a laser beam to heat a substrate by using a plurality of pulsed laser beams, according to another embodiment of the present invention. FIG. 12 is a graph showing that a plurality of pulsed laser beams are used to heat a substrate, according to another embodiment of the present invention.

As described above in relation to FIG. 4, according to the present invention, a substrate is heated using a pulsed laser beam L. When the pulsed laser beam L is used, the temperature of the substrate may be increased within a short time and thus a process time may be reduced and damage due to heat of an apparatus may be minimized. On the other hand, as shown in FIG. 3, the temperature of the substrate is rapidly decreased during an off time between pulses and thus heating efficiency is not high.

Because the laser beam generator 40 generates a pulsed laser beam L having a high energy of several to several tens of kW, there may be a limitation in reducing a pulse period. For example, the laser beam generator 40 generates a pulsed laser beam L having a pulse width of 10 ms, a pulse period of 10 Hz, and an energy of 60 J. An off time between pulses is long (e.g., about 0.1 s) and thus the substrate may be cooled during the off time.

Therefore, according to another embodiment of the present invention, substrate heating efficiency may be increased by reducing the time when the substrate is cooled, i.e., the off time between pulses of the pulsed laser beam L.

The substrate processing system 10 may include a plurality of laser beam generators 40: 40-1 and 40-2. FIGS. 11 and 12 show that each substrate processing apparatus 50 heats a substrate by using two pulsed laser beams L1-1 and L1-2. Referring to FIG. 11, the substrate processing system 10 may include two laser beam generators 40-1 and 40-2, and six substrate processing apparatuses 50*a* to 50*f* may receive pulsed laser beams L1-1, L1-2, L2-1, L2-2, . . . , L6-1, and L6-2 from the two laser beam generators 40-1 and 40-2. The laser beam generator 40-1 may include laser beam distribution units 45*a*-1, 45*b*-1, and 45*c*-1, and the laser beam generator 40-2 may include laser beam distribution units 45*a*-2, 45*b*-2, and 45*c*-2.

Referring to FIG. 12, each of the two laser beam generators 40-1 and 40-2 may irradiate one pulsed laser beam L1-1 or L1-2 onto one substrate processing apparatus 50*a*. The substrate W may be heated by receiving a total of two pulsed laser beams L1-1 and L1-2. The pulsed laser beam L1-1, L2-1, and L3-1, or L1-2, L2-2, and L3-2 generated by each laser beam generator 40-1 or 40-2 is irradiated with high energy (or maximum energy) for one pulse and has a time interval t1 or t2 until a next pulse. In this specification, a pulse initially irradiated by the first pulsed laser beam L1-1 or L1-2 generated by each laser beam generator 40-1 or 40-2 is referred to as a first pulse region, a pulse subsequently irradiated is referred to as a second pulse region, and an interval from the beginning of the first pulse region to the beginning of the second pulse region is referred to as t1 or t2.

Because one pulse laser beam L1-1 and L2-1 generated by one laser beam generator 40-1 has a high energy of several to several tens of kW, there is a limitation in reducing a pulse period. A time between first and second pulse regions of the pulsed laser beam L1-1 and L2-1 may correspond to the shortest period within a set power of the pulsed laser beam L1-1 and L2-1. A time between first and second pulse regions of the pulsed laser beam L1-2 and L2-2 may correspond to the shortest period within a set power of the pulsed laser beam L1-2 and L2-2. That is, t1 and t2 may not be easily reduced.

Therefore, the present invention is characterized in that at least two pulsed laser beams L1-1 and L1-2 are alternately irradiated onto the substrate W between pulse regions. In other words, onto one substrate processing apparatus 50*a*, the first pulsed laser beam L1-1 generated by the first laser beam generator 40-1 may initially irradiate a pulse and then, before second pulse irradiation, the first pulsed laser beam L1-2 generated by the second laser beam generator 40-2 may initially irradiate a pulse.

For example, the pulsed laser beams L1-1 and L1-2 may be irradiated onto the first substrate processing apparatus 50*a* in the order of a first pulse region of the first pulsed laser beam L1-1 generated by the first laser beam generator 40-1→a first pulse region of the first pulsed laser beam L1-2 generated by the second laser beam generator 40-2→a second pulse region of the first pulsed laser beam L1-1 generated by the first laser beam generator 40-1→a second pulse region of the first pulsed laser beam L1-2 generated by the second laser beam generator 40-2, etc. As additional example, the pulsed laser beams L2-1 and L2-2 may be irradiated onto the second substrate processing apparatus 50*b* in the order of a first pulse region of the second pulsed laser beam L2-1 generated by the first laser beam generator 40-1→a first pulse region of the second pulsed laser beam L2-2 generated by the second laser beam generator 40-2→a second pulse region of the second pulsed laser beam L2-1 generated by the first laser beam generator 40-1→a second pulse region of the second pulsed laser beam L2-2 generated by the second laser beam generator 40-2, etc.

As described above, because two pulsed laser beams L1-1 and L1-2 from two laser beam sources irradiate pulses in series onto one substrate processing apparatus 50, after the substrate W is heated by the pulsed laser beam L1-1 of the first laser beam generator 40-1, before being cooled, the substrate W may be heated again by the pulsed laser beam L1-2 of the second laser beam generator 40-2. As such, the substrate W may be efficiently heated using the pulsed laser beams L1-1 and L1-2. In addition, when two or more laser beam generators 40: 40-1 and 40-2 are included, although any one laser beam generator 40 has an error, the other laser beam generator may be used to perform a thermal ALE or ALD process and thus process stability 40 may be increased. Although two laser beam generators 40-1 and 40-2 are shown in FIGS. 11 and 12, pulses may be irradiated in serial onto the substrate processing apparatuses 50 by using three or more laser beam generators 40.

According to the above-described substrate processing module 10 of the present invention, a laser beam generated by the laser beam generator 40 may be distributed to a plurality of substrate processing apparatuses 50 at time intervals and thus the high-priced laser device may be efficiently used. In addition, by irradiating a plurality of pulsed laser beams in series, cooling of a substrate may be reduced in a substrate heating procedure and the substrate may be efficiently heated.

As described above, according to an embodiment of the present invention, a laser device may be efficiently used to heat substrates in a procedure of heating the substrates by using laser beams.

In addition, according to an embodiment of the present invention, laser beams may be provided to a plurality of substrate processing apparatuses by using one or a small number of laser devices.

However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate processing module comprising a plurality of substrate processing apparatuses each comprising:

a process chamber having a processing space therein;

a support unit for supporting a substrate in the processing space;

a gas supply unit for supplying a process gas into the processing space;

a plasma source for forming plasma from the process gas supplied into the processing space; and a laser unit for heating the substrate by irradiating a laser beam onto the substrate, wherein the substrate processing module further comprises:

a laser beam generator for generating a laser beam; and a laser beam distribution unit for receiving the laser beam from the laser beam generator and distributing the laser beam to the laser units of the plurality of substrate processing apparatuses at time intervals.

2. The substrate processing module of claim 1, wherein the laser unit includes an optical fiber, and wherein the laser beam distribution unit is provided in plural, and wherein each of the plurality of laser beam distribution units distributes the laser beam to the laser units of at least two substrate processing apparatuses among the plurality of substrate processing apparatuses at time intervals.

3. The substrate processing module of claim 1, wherein the laser beam distribution unit is provided in plural, and wherein each laser beam distribution unit distributes the laser beam to the laser units of at least two substrate processing apparatuses among the plurality of substrate processing apparatuses at time intervals.

4. The substrate processing module of claim 3, comprising a plurality of laser beam generators, wherein each laser beam distribution unit distributes the laser beam to the laser units of the same number or a different number of at least two substrate processing apparatuses at time intervals.

5. The substrate processing module of claim 1, wherein the laser beam distribution unit is comprised in the laser beam generator.

6. The substrate processing module of claim 1, wherein the laser beam is a pulsed laser beam.

7. The substrate processing module of claim 1, wherein a time taken for the laser beam distribution unit to distribute the laser beam to each of the laser units of the plurality of substrate processing apparatuses is selected from a range of 1 nanosecond (ns) to 100 milliseconds (ms).

8. The substrate processing module of claim 1, wherein at least one electrode of the plasma source is a transparent electrode, and wherein the laser beam passes through the transparent electrode and is irradiated onto the substrate.

9. The substrate processing module of claim 1, wherein the substrate processing apparatuses include a thermal atomic layer etching (ALE) apparatus or a thermal atomic layer deposition (ALD) apparatus.

10. The substrate processing module of claim 9, wherein the thermal ALE apparatus or the thermal ALD apparatus performs one process cycle of the thermal ALE or the thermal ALD process within a process time selected from a range of 5 seconds (s) to 60 s, and wherein the laser beam distribution unit distributes the laser beam to the laser units of the substrate processing apparatuses within the process time.

11. The substrate processing module of claim 10, wherein the substrate processing apparatuses sequentially start process cycles with different start timings.

12. The substrate processing module of claim 10, wherein the process time of the process cycle is longer than a product of a time taken to distribute the laser beam to one substrate processing apparatus and the number of substrate processing apparatuses.

13. The substrate processing module of claim 1, wherein the laser beam distribution unit comprises:

a module housing; and a distribution member disposed inside the module housing to distribute an incident laser beam to a first path or a second path.

14. The substrate processing module of claim 13, wherein the distribution member is provided as a mirror that reflects the incident laser beam to the first or second path.

15. The substrate processing module of claim 14, wherein the laser beam distribution unit comprises a plurality of distribution members, and wherein the incident laser beam is distributed to paths at least one more than the number of distribution members.

16. The substrate processing module of claim 6, comprising a plurality of laser beam generators, wherein laser beams generated by the laser beam generators are irradiated onto one substrate processing apparatus, and wherein a first pulsed laser beam generated by a first laser beam generator and a first pulsed laser beam generated by a second laser beam generator are irradiated in such a manner that a first pulse region of the first pulsed laser beam generated by a second laser beam generator is positioned between first and second pulse regions of the first pulsed laser beam generated by a first laser beam generator.

17. A substrate processing module comprising a plurality of substrate processing apparatuses used for a thermal atomic layer etching (ALE) or atomic layer deposition (ALD) process, each substrate processing apparatus comprising:

a process chamber having a processing space therein;

a support unit for supporting a substrate in the processing space;

a gas supply unit for supplying a process gas into the processing space;

a plasma source for forming plasma from the process gas supplied into the processing space; and a laser unit for heating the substrate by irradiating a pulsed laser beam onto the substrate, wherein the substrate processing module further comprises:

a laser beam generator for generating a pulsed laser beam; and a laser beam distribution unit for receiving the pulsed laser beam from the laser beam generator and distributing the pulsed laser beam to the laser units of the plurality of substrate processing apparatuses at time intervals, wherein one cycle of the thermal ALE or ALD process is 5 seconds (s) to 60 s, wherein a start timing of the one cycle is shifted for the substrate processing apparatuses, and wherein the laser beam distribution unit distributes the pulsed laser beam to the laser units of the substrate processing apparatuses within the one cycle.

* * * * *